United States Patent
Chiou

(10) Patent No.: US 7,750,719 B2
(45) Date of Patent: Jul. 6, 2010

(54) LEVEL SHIFTER CONCEPT FOR FAST LEVEL TRANSIENT DESIGN

(75) Inventor: Yu-Wen Chiou, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 0 days.

(21) Appl. No.: 12/616,302

(22) Filed: Nov. 11, 2009

(65) Prior Publication Data

US 2010/0052764 A1 Mar. 4, 2010

Related U.S. Application Data

(62) Division of application No. 11/868,417, filed on Oct. 5, 2007, now Pat. No. 7,642,834.

(30) Foreign Application Priority Data

Mar. 26, 2007 (TW) .............................. 96110327 A

(51) Int. Cl.
H03L 5/00 (2006.01)
(52) U.S. Cl. ...................................... 327/333; 327/534
(58) Field of Classification Search .................. 326/80, 326/81; 327/318, 319, 333, 534, 535
See application file for complete search history.

(56) References Cited

U.S. PATENT DOCUMENTS

| 6,049,245 | A  | * | 4/2000  | Son et al. ..................... 327/544 |
| 6,351,173 | B1 | * | 2/2002  | Ovens et al. ................. 327/333 |
| 6,373,285 | B1 | * | 4/2002  | Konishi ........................ 326/81 |
| 6,373,321 | B1 | * | 4/2002  | Yamauchi et al. ............ 327/534 |
| 6,552,596 | B2 | * | 4/2003  | Cowles et al. ............... 327/318 |
| 6,806,757 | B2 | * | 10/2004 | Mukai .......................... 327/333 |
| 7,176,741 | B2 | * | 2/2007  | Ishikawa et al. ............. 327/333 |
| 7,443,223 | B2 | * | 10/2008 | Bajkowski et al. .......... 327/333 |

* cited by examiner

Primary Examiner—Jeffrey S Zweizig
(74) Attorney, Agent, or Firm—J.C. Patents

(57) ABSTRACT

A driving circuit is provided by the invention. The driving circuit includes a level shifter, a buffer and a switch. The switch is coupled between an operation voltage and a power supply terminal of the first buffer for controlling a power-supplying time of the first buffer. While the level shifter is transiting, the switch is turned off, and the switch is turned on after the level shifter completes the transition. Therefore, the transition time of the level shifter is different from the transition time of the buffer so as to avoid simultaneously conducting large currents to adversely affect the transition capability of the level shifter.

5 Claims, 14 Drawing Sheets

502

LEVEL SHIFTER CONCEPT FOR FAST LEVEL TRANSIENT DESIGN

CROSS-REFERENCE TO RELATED APPLICATION

This application is a divisional application of and claims priority benefit of U.S. application Ser. No. 11/868,417, filed on Oct. 5, 2007, now U.S. Pat. No. 7,642,834, which claims the priority benefit of Taiwan application serial no. 96110327, filed on Mar. 26, 2007. The entirety of each of the above-mentioned patent applications is hereby incorporated by reference herein and made a part of this specification.

BACKGROUND OF THE INVENTION

1. Field of the Invention

The invention generally relates to a display, and more particularly, to a driving circuit of a display.

2. Description of Related Art

FIG. 1 is a diagram of a conventional driving circuit for a display. Referring to FIG. 1, a driving circuit 100 includes a latch unit 105, a low-voltage buffer 110, a level shifter 120 and a buffer 130. The level shifter 120 converts an input voltage VIN into an output voltage VOUT with a larger voltage fluctuation.

When the voltage level of the input voltage VIN is changed, the level shifter 120 and the buffer 130 would simultaneously transit the levels thereof (a transition from a high-level to a low-level or from a low-level to a high-level). While the level shifter 120 is transiting, the level shifter 120 and the buffer 130 may conduct a large current due to a tri-state that the level shifter 120 and the buffer 130 are in, which would establish a larger voltage drop across a parasitic resistor of a ground terminal. Since the current path in a chip contains a parasitic resistance, the large current of the level shifter 120 and the buffer 130 conduct would pull up the voltage level of the ground terminal. At this time, if the level shifter 120 has a poor transition capability, a transition may fail in response to the voltage drop at the ground terminal.

A circuit, for example, a driving circuit of a liquid crystal display (LCD) is usually composed of multiple level shifters and multiple buffers, which conduct a larger current during the transiting thereof to increase the voltage drop of the ground terminal. Thus, the level shifters are more likely affected thereby and fail to transit.

SUMMARY OF THE INVENTION

Accordingly, the invention is directed to a driving circuit enabling the level shifter and the buffer thereof to transit asynchronously so as to avoid producing a large current to adversely affect the transiting operation of the level shifter.

The invention is also directed to a driving circuit including a switch between the level shifter and the buffer thereof to enable the level shifter and the buffer to transit asynchronously so as to avoid the level shifter from a transition disturbance.

The invention is also directed a driving circuit to enable the buffer only after the level shifter completes a transition so as to avoid a large current produced by simultaneous transitions and enhance the transition capability of the driving circuit.

As embodied and broadly described herein, the invention provides a driving circuit, which includes a level shifter, a buffer and a first switch, wherein the level shifter is employed for converting the voltage level of an input voltage; the first switch is coupled between the level shifter and the buffer, the first switch is turned off during the transition of the level shifter and is turned on after the level shifter completes a transition.

In an embodiment of the invention, the driving circuit includes a second switch coupled between an operation voltage and the input terminal of the buffer, wherein when the first switch is turned on, the second switch is turned off, and when the first switch is turned off, the second switch is on.

The invention provides a driving circuit, which includes a level shifter, a first buffer, a second buffer, a first switch and a second switch. The level shifter is employed for converting the voltage level of an input voltage, the first switch is coupled between the level shifter and the first buffer, and the second switch is coupled between the first buffer and the second buffer. The first switch and the second switch are turned off during the transition of the level shifter and are turned on after the level shifter completes a transition.

In an embodiment of the invention, the driving circuit includes a third switch coupled between an operation voltage and the input terminal of the first buffer, wherein when the first switch is turned on, the third switch is turned off; and when the first switch is turned off, the third switch is turned on.

The invention provides a driving circuit, which includes a level shifter, a buffer and a switch. The level shifter is employed for converting the voltage level of an input voltage, the buffer is coupled to the output terminal of the level shifter and the switch is coupled between an operation voltage and the power supply terminal of the buffer for controlling the power-supplying time. The switch is turned off during the transiting of the level shifter and is turned on after the level shifter completes a transition so as to delay the time point at which the buffer starts a transition.

The invention further provides a driving circuit, which includes a level shifter, a buffer and a switch. The level shifter is employed for converting the voltage level of an input voltage, the buffer is coupled to the output terminal of the level shifter and the switch is coupled between a ground terminal and the buffer. The switch is turned off during the transition of the level shifter and is turned on after the level shifter completes a transition so as to avoid the level shifter and the buffer from transiting simultaneously to cause a voltage drop at the ground terminal.

The invention further provides a driving circuit, which includes a level shifter, a buffer, a first resistor, a second resistor, a first switch and a second switch. The level shifter is employed for converting the voltage level of an input voltage, the buffer is coupled to the output terminal of the level shifter and operated between an operation voltage and a ground terminal, the first resistor is coupled between the operation voltage and the buffer, the second resistor is coupled between the ground terminal and the buffer, the first switch is connected to the first resistor in parallel and the second switch is connected to the second resistor in parallel. The first switch and the second switch are turned off during the transition of the level shifter and are turned on after the level shifter completes a transition so as to lower the current conducted by the buffer during the transiting of the buffer.

In summary, the invention makes the transition time of the level shifter asynchronous from the transition time of the buffer to avoid a large current caused by the simultaneous transitions to adversely affect the voltage level of the ground terminal. Thus, the level shifter of the invention is able to transit in a normal bias voltage and the driving circuit accordingly has an enhanced transition capability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
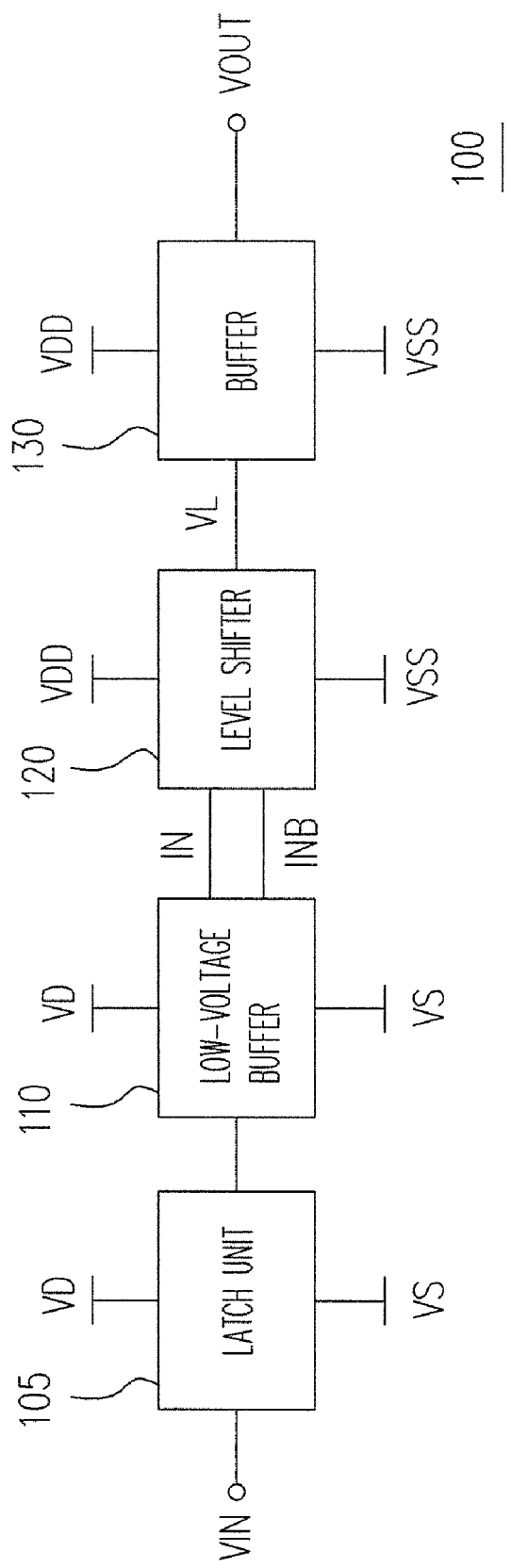
FIG. 1 is a diagram of a conventional driving circuit.

Reference will now be made in detail to the present embodiments of the invention, examples of which are illustrated in the accompanying drawings. Wherever possible, the same reference numbers are used in the drawings and the description to refer to the same or like parts.

Figure 2:
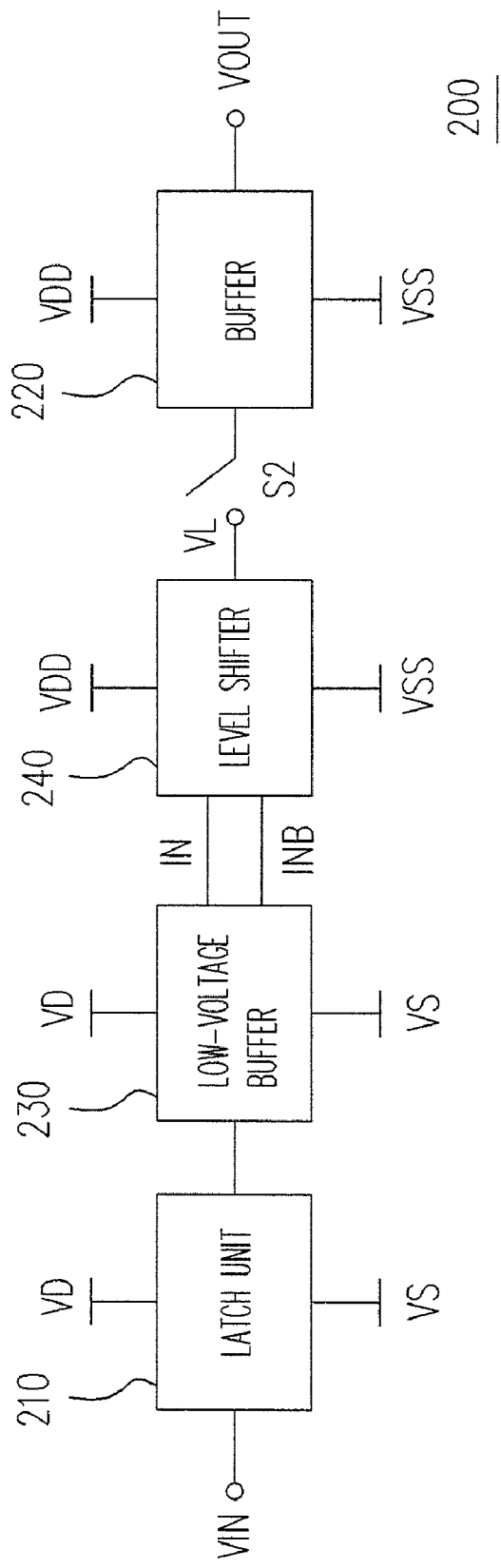
FIG. 2 is a diagram of a driving circuit according to an embodiment of the invention.

FIG. 2 is a diagram of a driving circuit according to an embodiment of the invention. A driving circuit 200 includes a latch unit 210, a low-voltage buffer 230, a level shifter 240, a switch S2 and a buffer 220, wherein the switch S2 is coupled between the level shifter 240 and the input terminal of the buffer 220. The level shifter 240 and the buffer 220 are operated between an operation voltage VDD and an operation voltage VSS, while the latch unit 210 and the low-voltage buffer 230 are operated between an operation voltage VD and an operation voltage VS. The operation voltage VDD can be greater than the operation voltage VD, while the operation voltage VSS can be less than the operation voltage VS. The low-voltage buffer 230 and the buffer 220 are respectively formed by an inverter.

The latch unit 210 receives an input voltage VIN for latching the input voltage VIN. The low-voltage buffer 230 receives the input voltage VIN via the latch unit 210 and outputs a first input voltage IN an a second input voltage INB, wherein the first input voltage IN and the second input voltage INB are phase-inverted to each other. As the level shifter 240 transits, the switch S2 is turned off, and after the level shifter 240 completes a transition according to the first input voltage IN and the second input voltage INB, a shifting voltage VL is produced. Next, the switch S2 is turned on for the buffer 220 to receive the shifting voltage VL to start a transition and thereby produce an output voltage VOUT. Since the level shifter 240 and the buffer 220 herein take different time points for transition, therefore, simultaneous generation of an instant large current to increase the voltage drop at the ground terminal may be avoided, which enables the level shifter 240 to have a better transition capability.

Figure 3A:
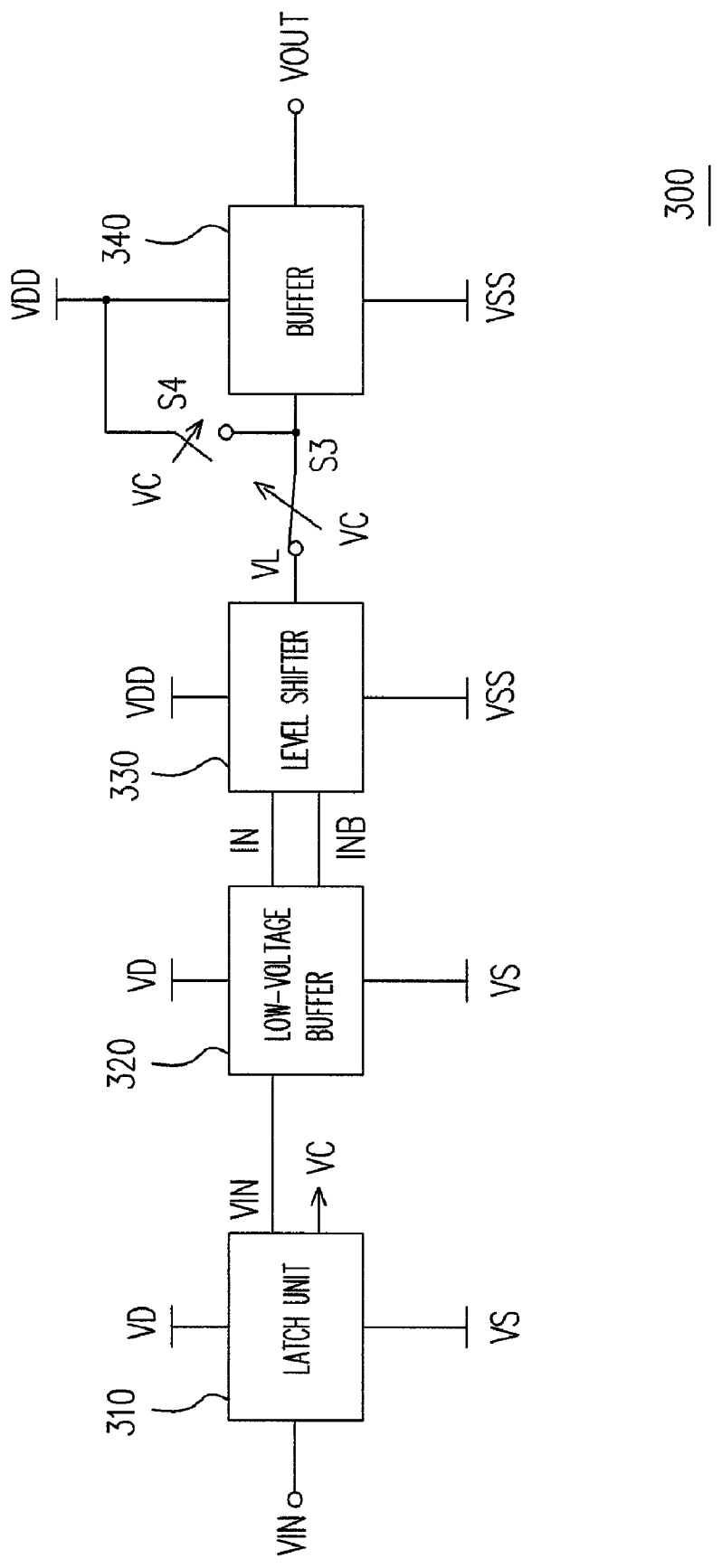
FIG. 3a is a diagram of a driving circuit according to another embodiment of the invention.

FIG. 3a is a diagram of a driving circuit according to another embodiment of the invention. A driving circuit 300 includes a latch unit 310, a low-voltage buffer 320, a level shifter 330, switches S3 and S4 and a buffer 340, wherein the switch S3 is coupled between the level shifter 330 and the input terminal of the buffer 340, while the switch S4 is coupled between an operation voltage VDD and the input terminal of the buffer 340. The latch unit 310 receives an input voltage VIN for latching the input voltage VIN and outputting a control signal VC, wherein the control signal VC can be produced in other way as well. The driving circuit 300 receives the input voltage VIN via the latch unit 310. The latch unit 310 and the low-voltage buffer 320 are operated between an operation voltage VD and an operation voltage VS, and the level shifter 330 and the buffer 340 are operated between the operation voltage VDD and an operation voltage VSS. Similarly, the operation voltage VDD can be greater than the operation voltage VD, the operation voltage VSS can be less than the operation voltage VS, and the operation voltage VS and the operation voltage VSS can be a voltage at the ground terminal.

In many application circuits, for example, in a driving circuit of a liquid crystal display screen, the latch unit 310 is usually employed for latching the input voltage VIN, and in the present embodiment, the input voltage VIN ranges between the operation voltage VD and the operation voltage VS. As the latch unit 310 outputs the latched input voltage VIN, the latch unit 310 at the time would enable the control signal VC. Thus, the switches S3 and S4 in the driving circuit 300 are turned on respectively according to the control signal VC so as to avoid the level shifter 330 and the buffer 340 from simultaneously transiting.

In the driving circuit 300, the low-voltage buffer 320 is employed for receiving the input voltage VIN provided by the latch unit 310 and thereby outputting a first input voltage IN and a second input voltage INB, wherein the first input voltage IN and the second input voltage INB are phase-inverted to each other. As the latch unit 310 outputs the input voltage VIN, the driving circuit 300 turns off the switch S3 and turns on the switch S4 according to the control signal VC. In this way, the buffer 340 would not transit along with while the level shifter 330 is outputting, and the turned on switch S4 enables the input terminal of the buffer 340 to sustain a high-voltage level to avoid a floating state. After the level shifter 330 completes a transition, the driving circuit 300 turns on the switch S3 and turns off the switch S4, so that the buffer 340 receives a shifting voltage VL for transiting and produces an output voltage VOUT. Since the level shifter 330 and the buffer 340 take different time points for transition, so as to avoid simultaneously producing an instant large current to cause a voltage drop at the ground terminal and to thereby affect the transition capability of the level shifter 330.

Figure 3B:
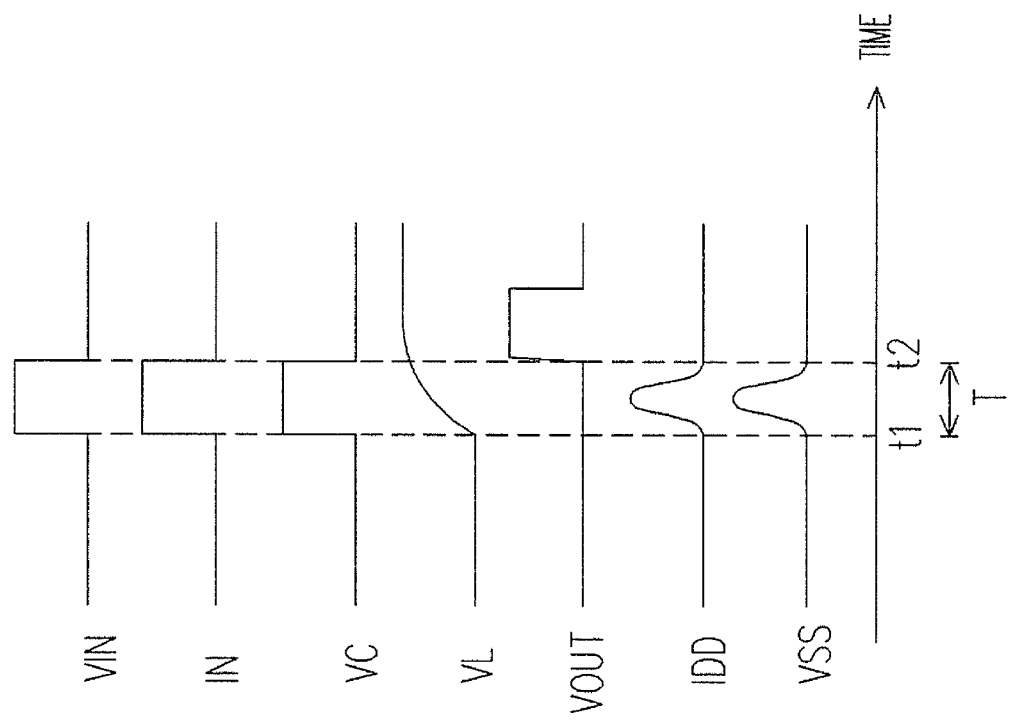
FIG. 3b is a signal timing diagram of a driving circuit according to another embodiment of the invention.

FIG. 3b is a signal timing diagram of a driving circuit. Referring to FIGS. 3a and 3b, the on/off states of the switches S3 and S4 in FIG. 3a are controlled by the control signal VC. At a time point t1, the input voltage VIN output from the latch unit 310 is transited from a low-level to a high-level, while the first input voltage IN is transited accordingly from a low-level to a high-level and the control signal VC is enabled. Therefore, as the level shifter 330 starts to transit, the shifting voltage VL gradually converts the level thereof to a high-level during a duration T and the converting speed depends on the transition capability of the level shifter 330. During the transition of the level shifter 330, i.e., during the duration T, the switch S3 is turned off and the switch S4 is turned on. Only after the level shifter 330 completes a transition, i.e., after a time point t2, the driving circuit 300 turns on the switch S3 and turns off the switch S4. It can be seen herein, only after the time point t2, the output voltage VOUT starts to be transited from the low-level to the high-level.

During the transition of the level shifter 330, the level shifter 330 may produce a leakage current IDD due to the transition and the operation voltage VSS thereof would rise due to the leakage current IDD. This is because there is a parasitic resistance on the conduction path of the current, and a rising conduction current would cause a voltage drop. When the rising level amplitude of the operation voltage VSS is excessive, the transition capability of the level shifter 330 is affected, so that the shifting voltage VL is unable to reach a proper level of rising or falling. The present embodiment is also suitable for the case of converting a high-level into a low-level, and anyone skilled in the art would be able to easily deduce the circuit principle according to the disclosure of the invention.

Figure 3C:
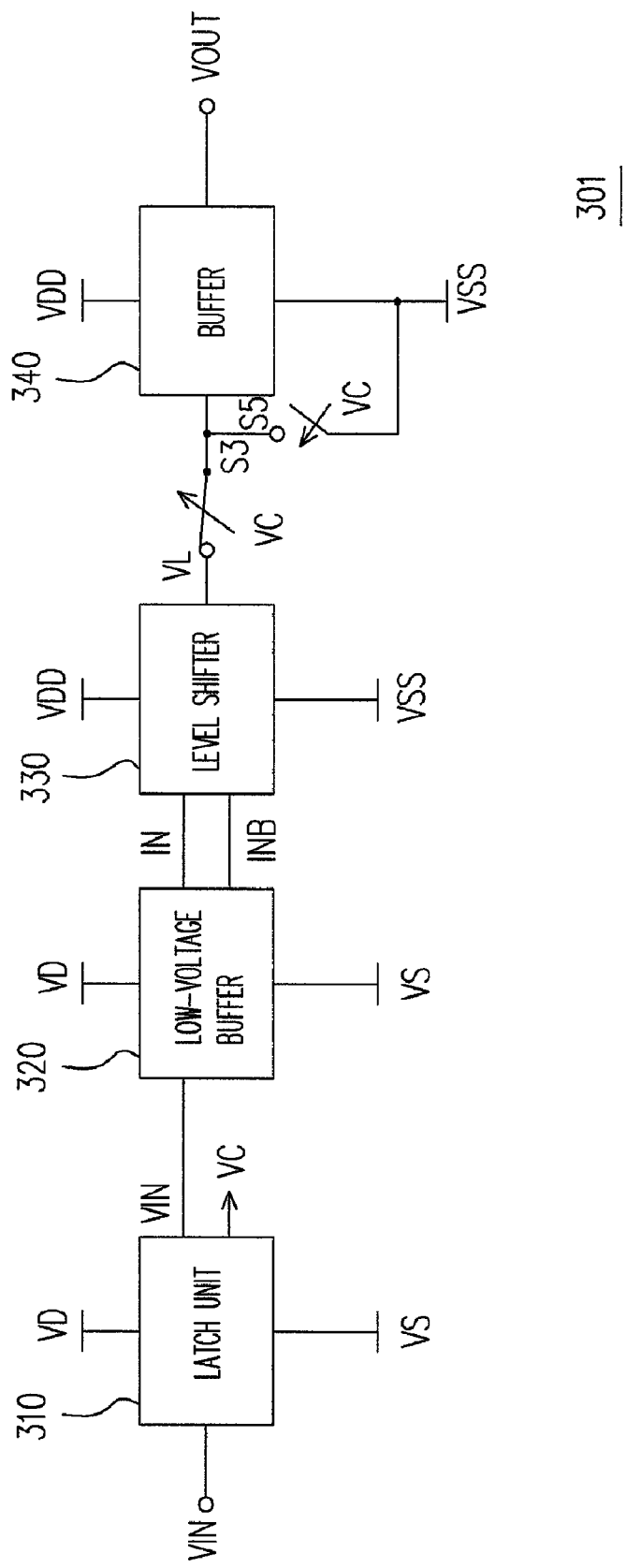
FIGS. 3c, 4a-4d, 5a-5d and 6 are diagrams of driving circuits according to various embodiments of the invention.

FIG. 3c is a diagram of a driving circuit according to another embodiment of the invention. The driving circuit 301 of FIG. 3c is similar to the driving circuit 300 in FIG. 3a, except that the switch S5 in FIG. 3c is coupled between the operation voltage VSS and the input terminal of the buffer 340. Here, the control signal VC is also used to turn off the switch S3 and turn on the switch S5 during the transition of the level shifter 330. After the level shifter 330 completes a transition, the switch S3 is turned on and the switch S5 is turned off, which enables the input terminal of the buffer 340 to receive the shifting voltage VL. In addition, the switches S3 and S5 are controlled not necessarily by using the control signal VC. In fact, the switches S3 and S5 can be controlled by other control signals.

Figure 4A:
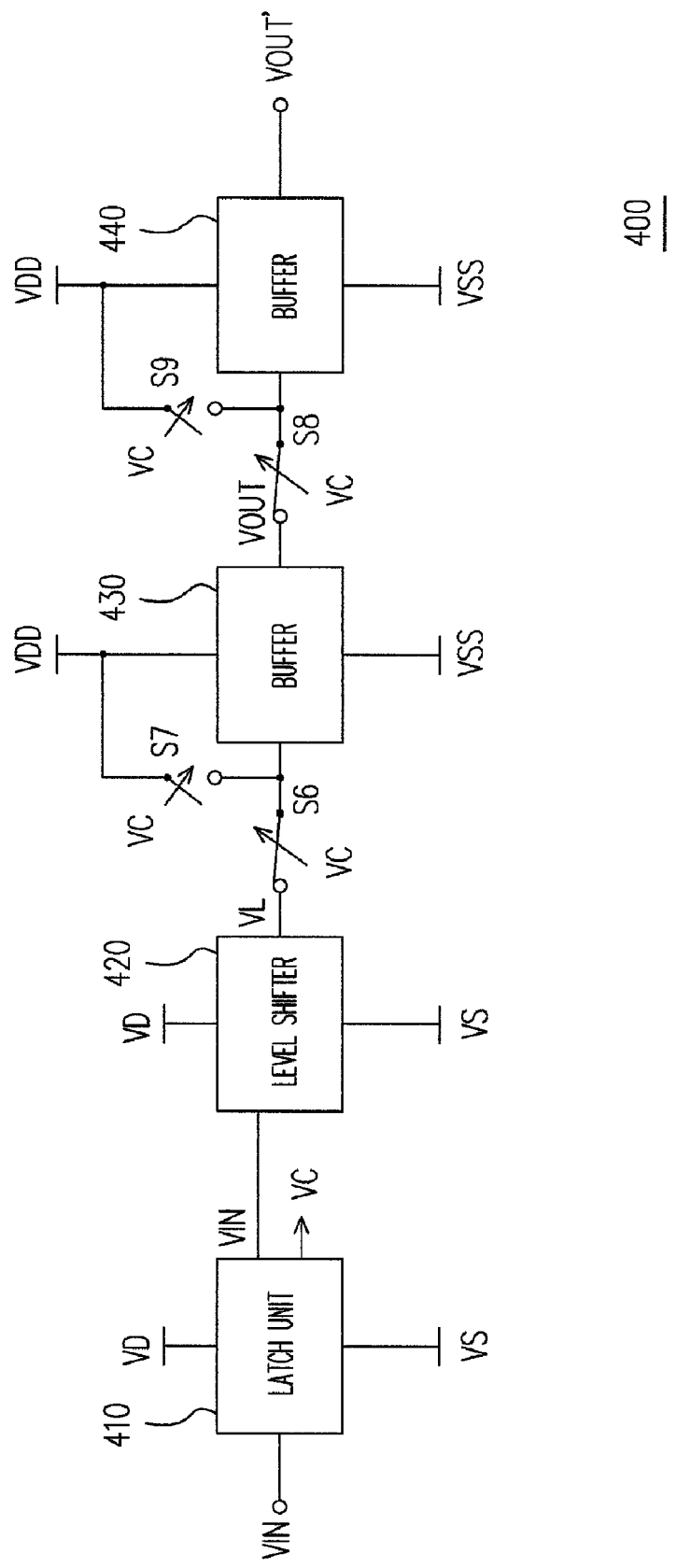

In the driving circuit for driving a liquid crystal display panel (LCD panel), the back-stage thereof further includes a digital-to-analog converter (DAC) to receive a digital signal composed of output voltages VOUT of multiple buffers and to convert the received digital signal into an analog voltage for driving the LCD panel. In an embodiment, the output voltages VOUT are to pass through another buffer, then, are input to the DAC. FIG. 4a is a diagram of a driving circuit according to another embodiment of the invention. The driving circuit 400 includes a latch unit 410, a level shifter 420, buffers 430 and 440 and switches S6, S7, S8 and S9, wherein the output voltage VOUT from the buffer 430 passes through the buffer 440 to produce another output voltage VOUT'. The switch S6 is coupled between the level shifter 420 and the buffer 430, the switch S8 is coupled between the buffer 430 and the buffer 440, the switch S7 is coupled between the operation voltage VDD and the input terminal of the buffer 430, and the switch S9 is coupled between the operation voltage VDD and the input terminal of the buffer 440. The latch unit 410 and the level shifter 420 are respectively operated between the operation voltage VD and the operation voltage VS, the buffer 430 and the buffer 440 are respectively operated between the operation voltage VDD and the operation voltage VSS, and the buffers 430 and 440 can be respectively implemented by an inverter.

Figure 4B:
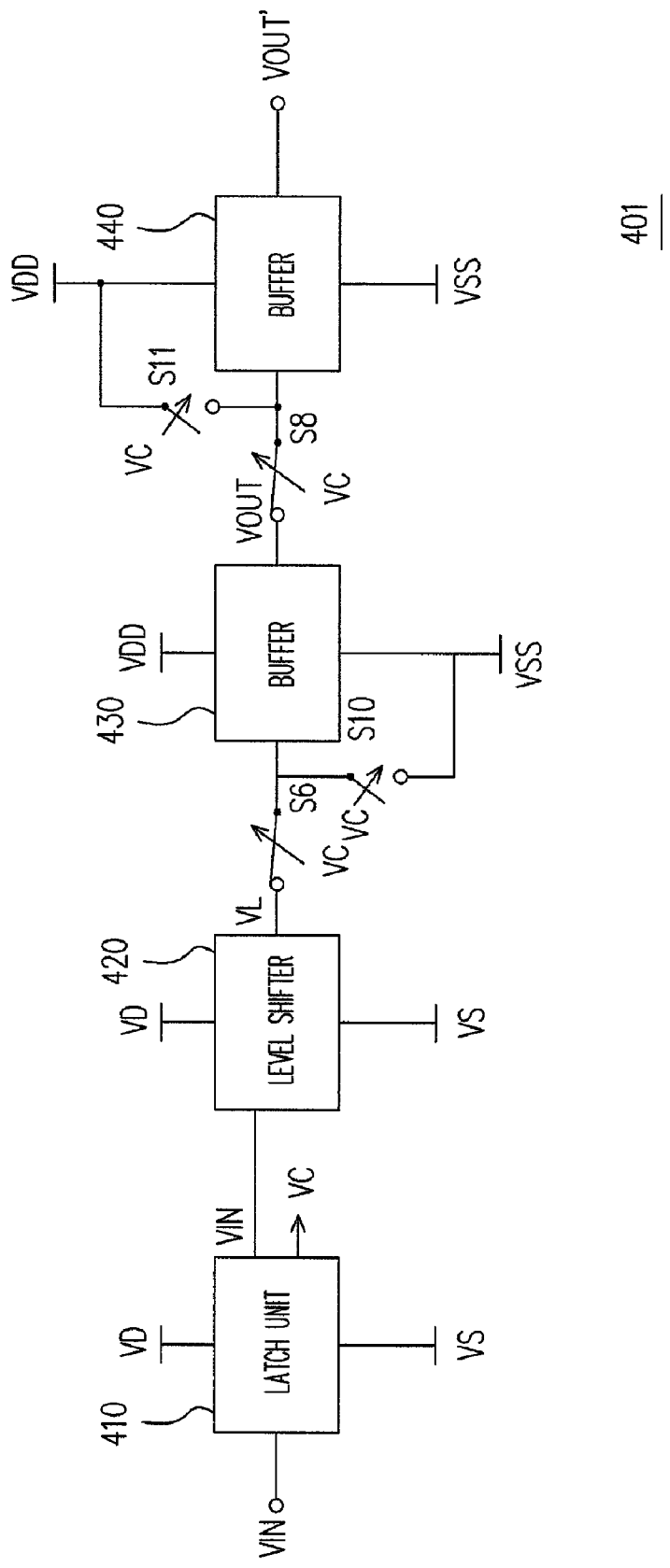
Figure 4C:
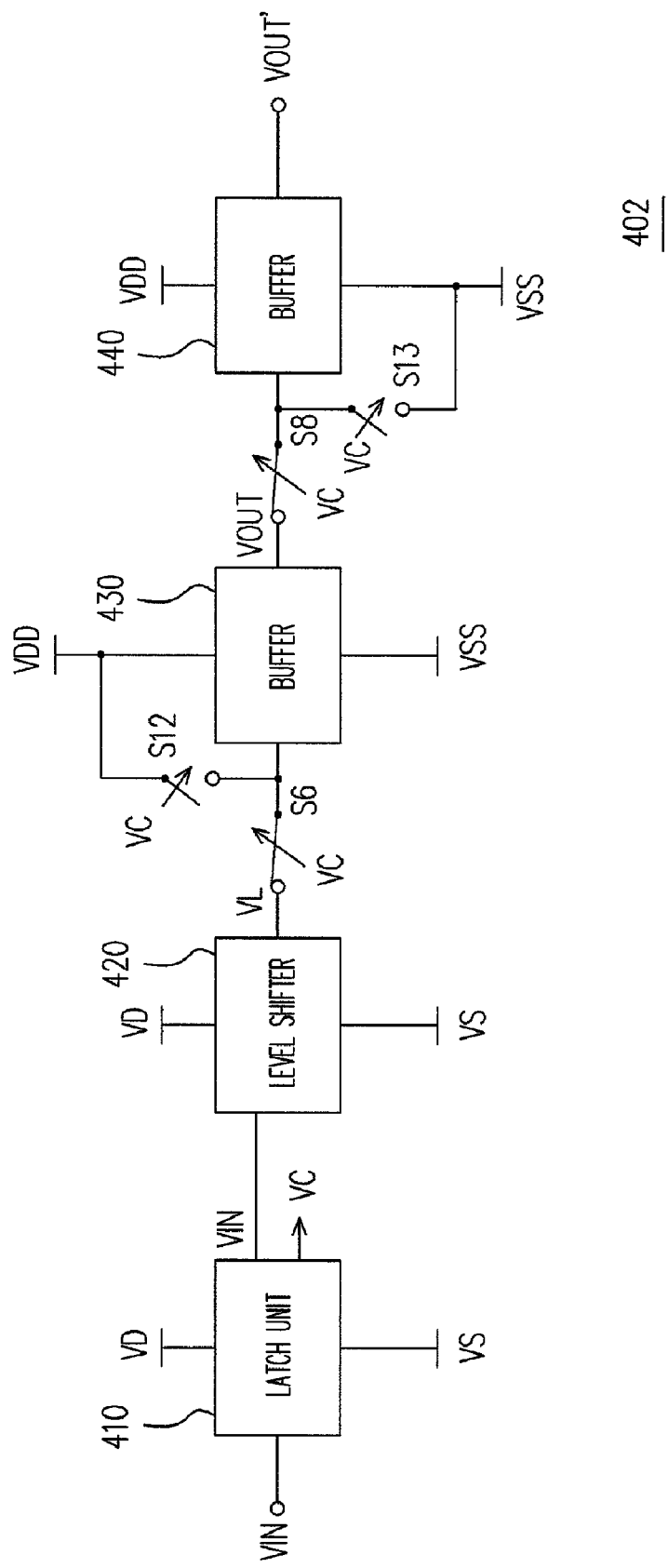
Figure 4D:
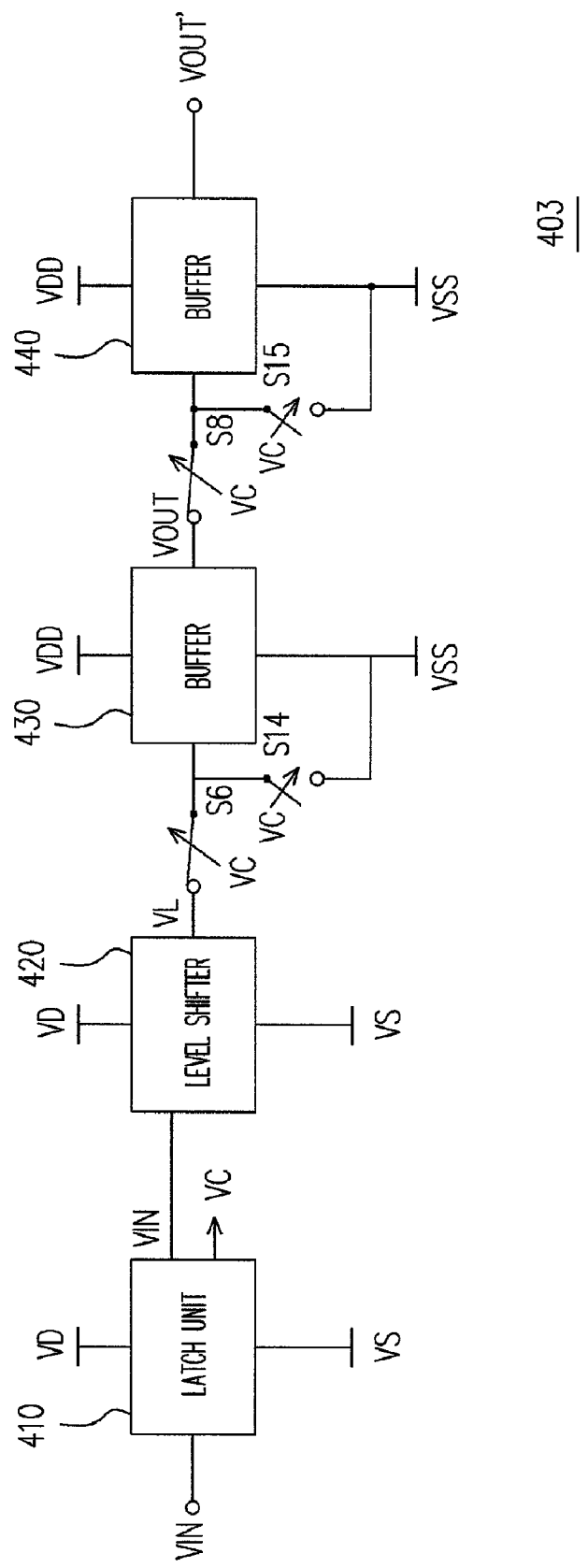

According to the above description, the switches S6 and S8 are disposed mainly for preventing the buffers 430 and 440 from a transiting simultaneously to the transiting of the level shifter 420, where the switches S6 and S8 are turned off during the transition of the level shifter 420. The switches S7 and S9 are disposed mainly for preventing the input terminals of the buffers 430 and 440 from a floating state, where the switches S7 and S9 are turned on during the transiting of the level shifter 420. It is noted that the switches S7 and S9 can be respectively disposed not only between the operation voltage VDD and the input terminals of the buffers 430 and 440, but also between the operation voltage VSS and the input terminals of the buffers 430 and 440 which functions in the same way to prevent the input terminals of the buffers 430 and 440 from a floating state. The configurations of other driving circuits 401-403 are shown by FIGS. 4b-4d; anyone skilled in the art would be able to deduce the principles thereof according to the disclosures of the invention, thus, they are omitted to describe for simplicity.

In another embodiment of the invention, the switches S6 and S8 in the FIGS. 4a-4d can also adjust the transition time points of the buffers 430 and 440 in a sequential conduction manner, where the switches S6 and S8 need to adjust the corresponding turning-on time point and turning-off time point so as to prevent the input terminals of the buffers 430 and 440 from a floating state. Anyone skilled in the art should be able to deduce the implementations thereof according to the disclosures of the invention, thus, they are omitted to describe for simplicity.

Figure 5A:
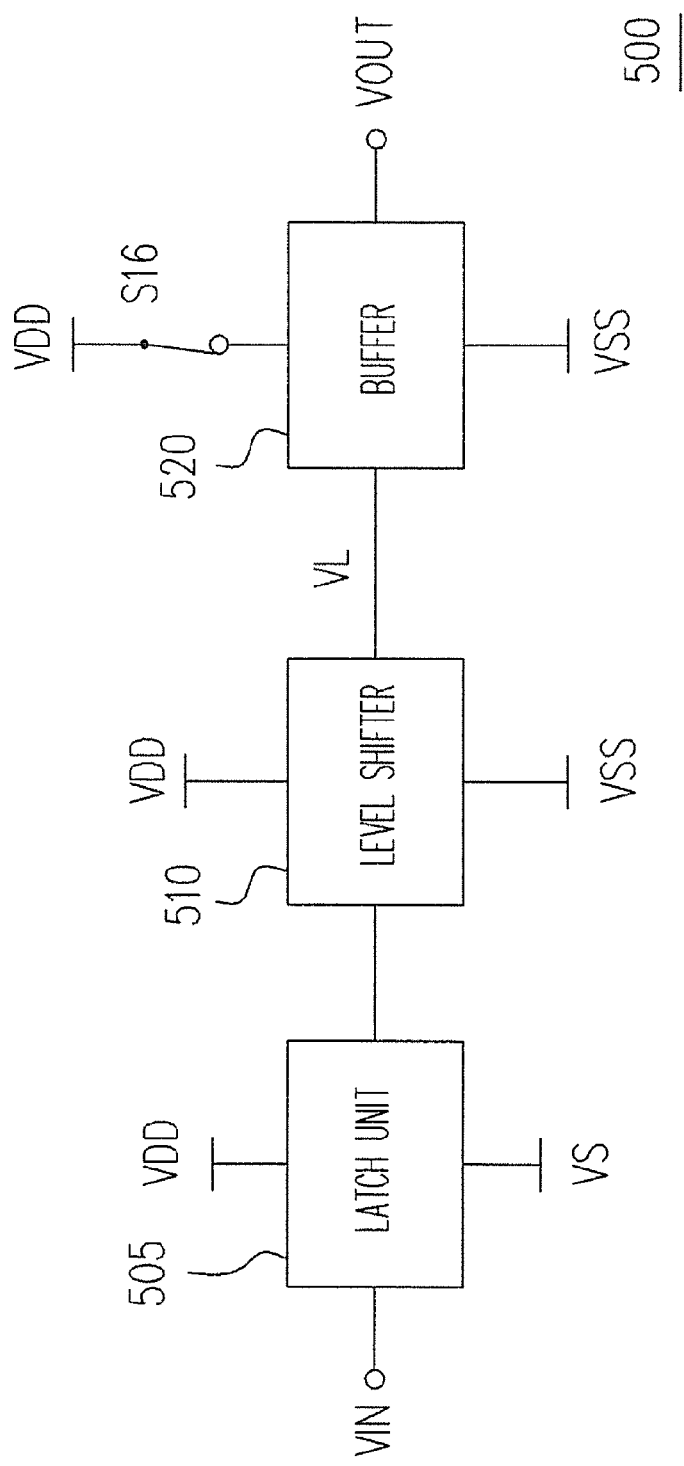
Figure 5B:
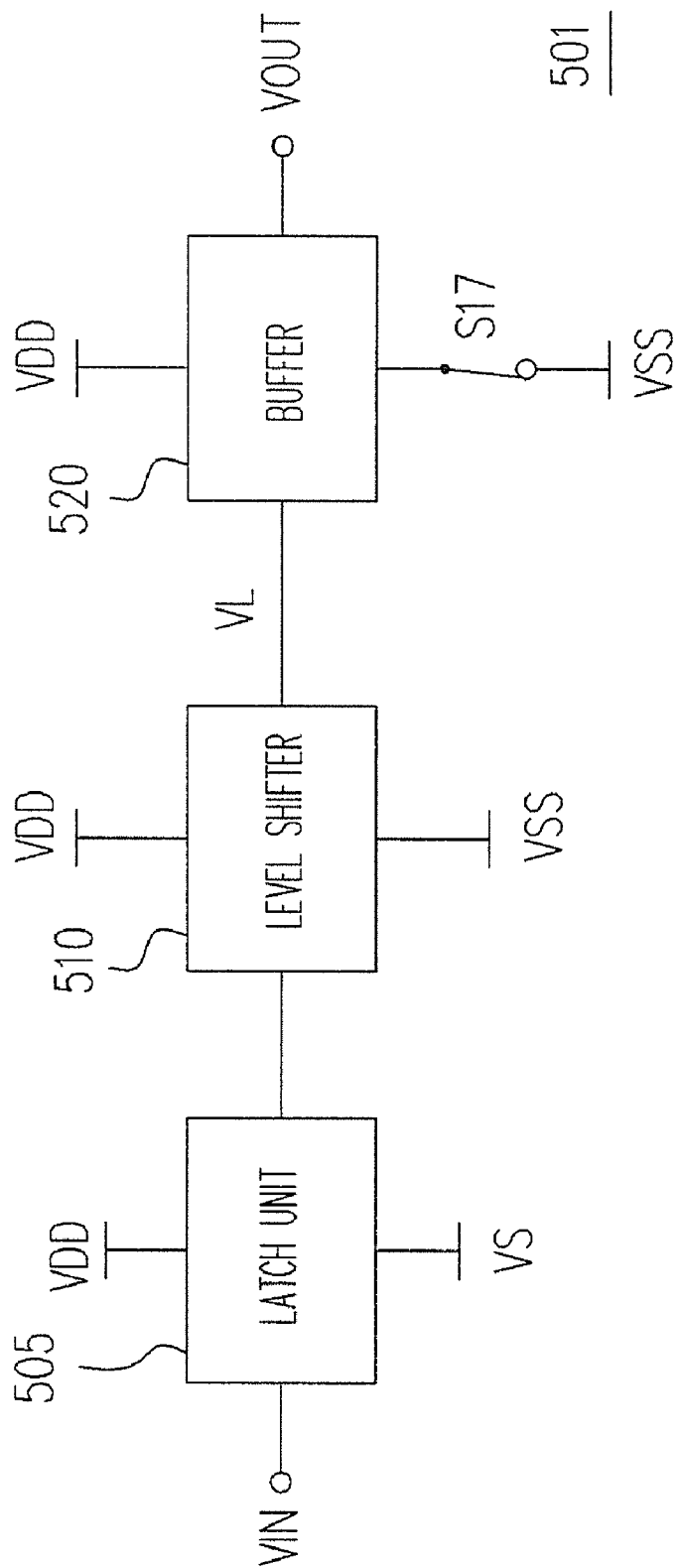

In yet another embodiment of the invention, the transiting time points of the buffers can be controlled by enabling/disabling the buffers, which are shown by FIGS. 5a-5d. FIG. 5a is a diagram of a driving circuit according to yet another embodiment of the invention. A driving circuit 500 includes a latch unit 505, a level shifter 510, a buffer 520 and a switch S16, wherein the switch S16 is coupled between an operation voltage VDD and the power supply terminal of the buffer 520 for controlling the power-supplying time. When the level shifter 510 is transiting, the switch S16 is turned off, which disables the buffer 520 so that the buffer 520 fails to transit along with the output of the level shifter 510. Once the level shifter 510 completes transition, the switch S16 is turned on and the buffer 520 starts a corresponding transition in response to the output of the level shifter 510. In addition, referring to FIG. 5b, a switch S17 in a driving circuit 501 is coupled between the buffer 520 and the operation voltage VSS, where the operation principle is similar to the above description and omitted to describe.

Figure 5C:
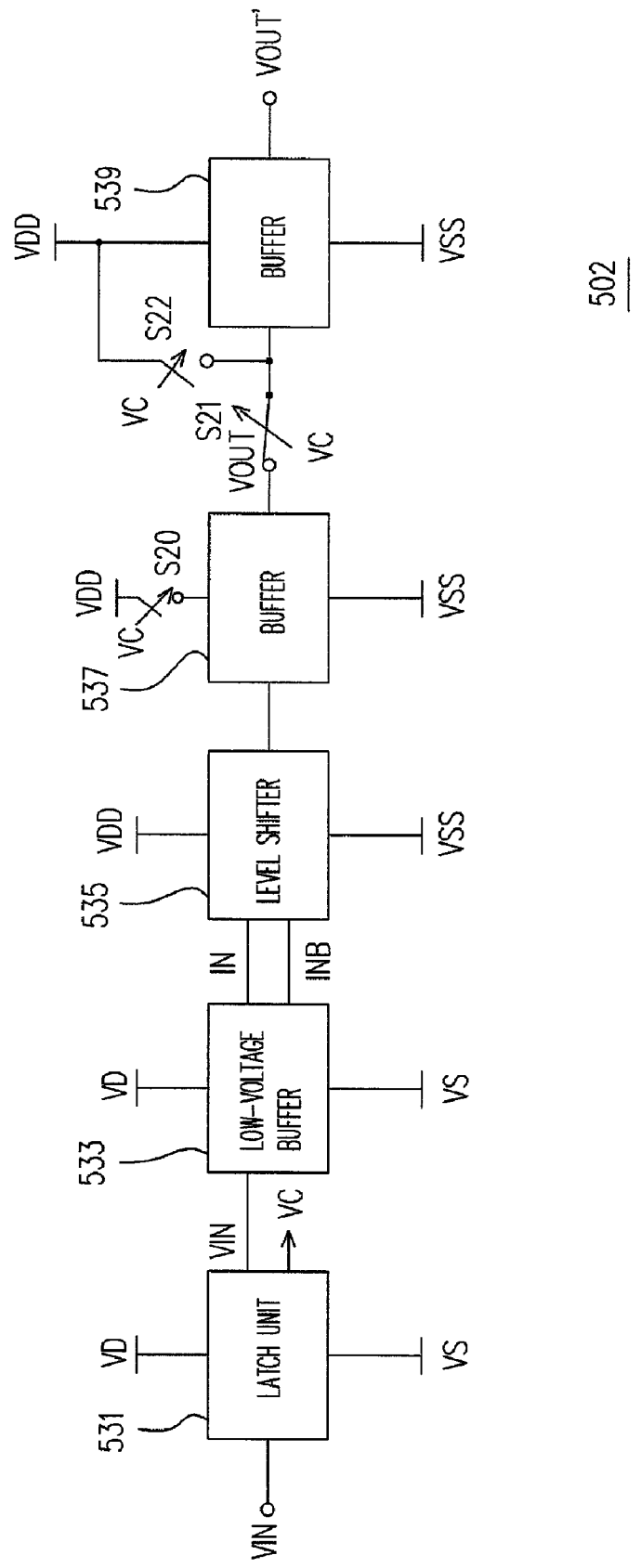
Figure 5D:
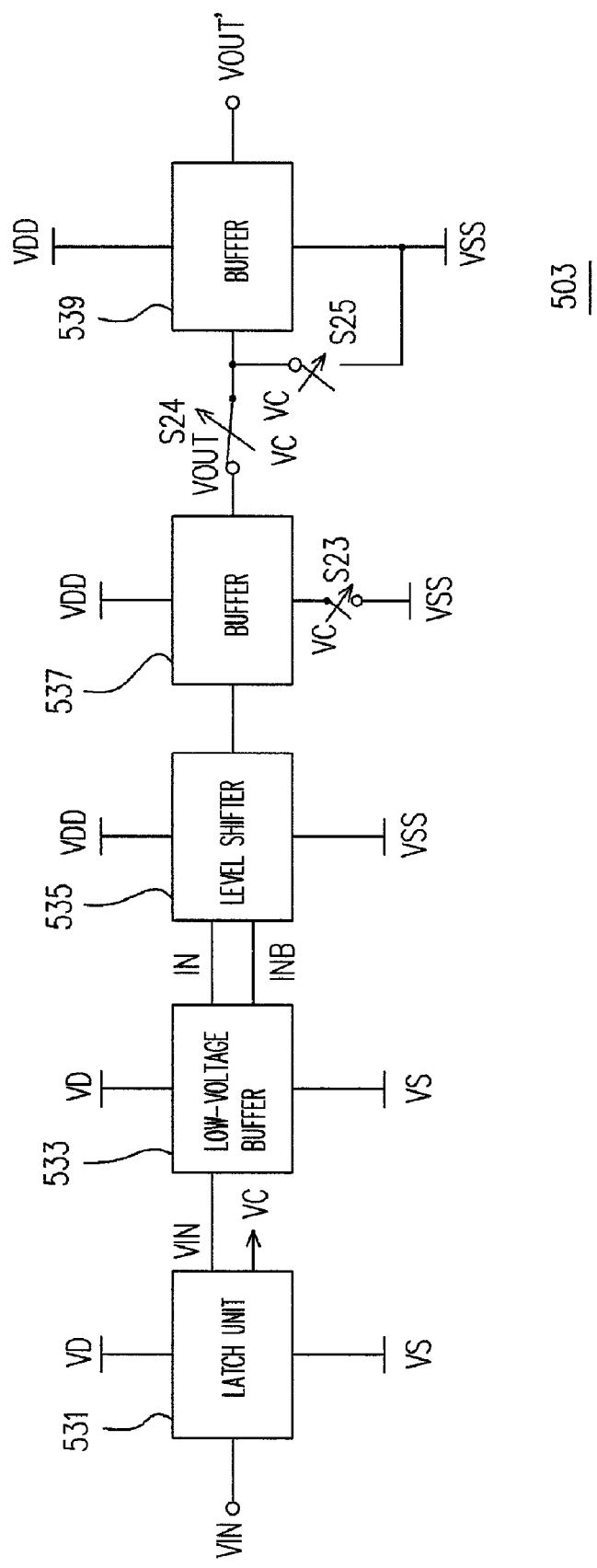

In FIG. 5c, a driving circuit 502 converts a low-level into a high-level. The driving circuit 502 includes a latch unit 531, a low-voltage buffer 533, a level shifter 535, buffers 537 and 539 and switches S20, S21 and S22. The switch S20 herein is coupled between an operation voltage VDD and the power supply terminal of the buffer 537 for controlling the power-supplying time of the buffer 537. During the transition of the level shifter 535, the switch S20 is turned off, which disables the buffer 537 so that the buffer 537 fails to transit with the output of the level shifter 535. Once the level shifter 535 completes transition, the switch S20 is turned on and the buffer 537 starts a corresponding transition in response to the output of the level shifter 535. The output voltage VOUT of the buffer 537 further passes through the buffer 539 to produce an output voltage VOUT'. The switch S21 is disposed mainly for preventing the buffers 537 and 539 from simultaneously transiting, so that the switch S21 are, for example, turned on only after the switch S20 is turned on for a while. The switch S22 is employed to prevent the input terminal of the buffer 539 from a floating state. In addition referring to FIG. 5d, a driving circuit 503 is similar to the driving circuit 502 except that the driving circuit 503 employs a switch S23 to control the power-supplying time of the buffer 537 and a switch S25 to prevent the buffer 539 from a floating state. In fact, the above-described embodiment can be suitable for converting a high-level into a low-level as well. Anyone skilled in the art would be able to deduce the principle thereof according to the disclosures of the invention, thus, it is omitted to describe for simplicity.

Figure 6:
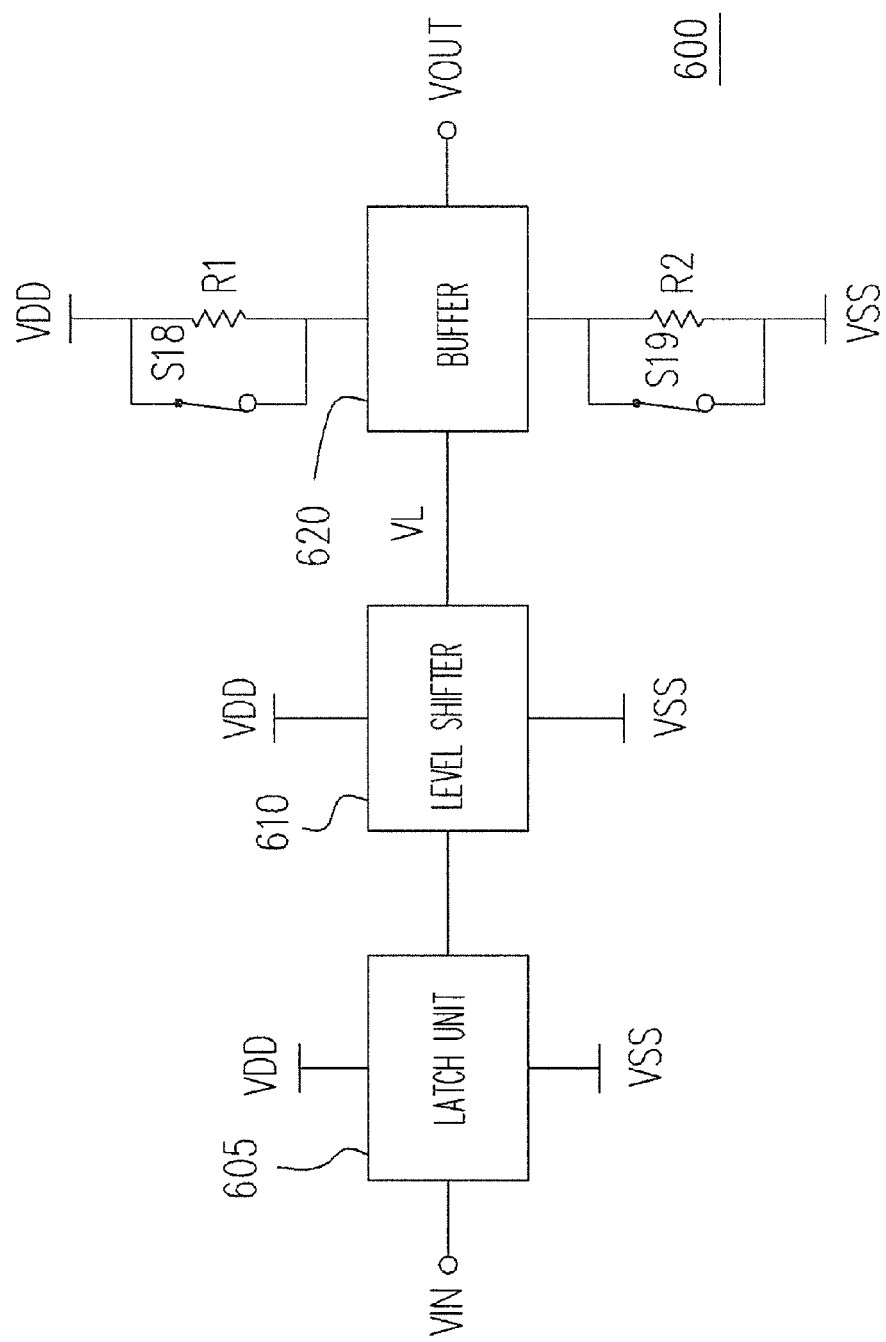

FIG. 6 is a diagram of a driving circuit according to yet another embodiment of the invention. In the present embodiment, resistors R1 and R2 are employed to lower the current conducted by the buffer so as to avoid the driving circuit 600 in FIG. 6 from producing a large current. The driving circuit 600 includes a latch unit 605, a level shifter 610, a buffer 620, resistors R1 and R2 and switches S18 and S19. The switch S18 and the resistor R1 are connected in parallel and coupled between an operation voltage VDD and the buffer 620; the switch S19 and the resistor R2 are connected in parallel connection and coupled between an operation voltage VSS and the buffer 620. During the transition of the level shifter 610, the switches S18 and S19 turned are off; once the level shifter 610 completes the transition, the switches S18 and S19 are turned on so as to lower the current the buffer 620 conducts during the transition thereof.

In the above-described embodiments, the operation voltages VD, VDD, VS and VSS represent the operation voltages of the latch unit, the level shifter, the buffer and so on, but the invention does not limit the above-mentioned configuration. In fact, the operation voltages VS and VSS can take a ground terminal voltage or other voltages (for example, a negative voltage value), all of which the driving circuit of the invention is still suitable for and they are omitted to describe herein.

In summary, the buffer and the level shifter of the invention do not transit at a same time, and the buffer is allowed to conduct a corresponding transition only after the level shifter completes the transition thereof. The scheme for the level shifter and the buffer to asynchronously transit is able to lower the leakage current of the driving circuit during transiting, which accordingly enhances the transition capability of the driving circuit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A driving circuit, comprising:
   a level shifter, for converting a level of an input voltage;
   a first buffer, coupled to an output terminal of the level shifter; and
   a first switch, coupled between an operation voltage and a power supply terminal of the first buffer for controlling a power-supplying time of the first buffer;
   wherein the first switch is turned off while the level shifter is transiting and is turned on after the level shifter completes the transition.

2. The driving circuit according to claim 1, further comprising:
   a second switch, having a first terminal coupled to the output terminal of the first buffer and a second terminal;
   a second buffer, having an input terminal coupled to the second terminal of the second switch; and
   a third switch, coupled between the operation voltage and the input terminal of the second buffer;
   wherein the second switch is turned on when the first switch is turned on so as to enable the second buffer to receive an output of the first buffer, the third switch is turned off when the second switch is turned on and the third switch is turned on when the second switch is turned off.

3. A driving circuit, comprising:
   a level shifter, for converting a level of an input voltage;
   a first buffer, coupled to an output terminal of the level shifter; and
   a first switch, coupled between a ground terminal and the first buffer;
   wherein the first switch is turned off while the level shifter is transiting and is turned on after the level shifter completes the transition.

4. The driving circuit according to claim 3, further comprising:
   a second switch, having a first terminal coupled to the output terminal of the first buffer and a second terminal;
   a second buffer, having an input terminal coupled to the second terminal of the second switch; and
   a third switch, coupled between the ground terminal and the input terminal of the second buffer;
   wherein the second switch is turned on when the first switch is turned on so as to enable the second buffer to receive the output of the first buffer, the third switch is turned off when the second switch is turned on and the third switch is turned on when the second switch is turned off.

5. A driving circuit, comprising:
   a level shifter, for converting a level of an input voltage;
   a buffer, coupled to an output terminal of the level shifter and operated between an operation voltage and a ground terminal;
   a first resistor, coupled between the operation voltage and the buffer;
   a second resistor, coupled between the ground terminal and the buffer;
   a first switch, connected in parallel to the first resistor; and
   a second switch, connected in parallel to the second resistor;
   wherein the first switch and the second switch are turned off while the level shifter is transiting, and the first switch and the second switch are turned on after the level shifter completes the transition so as to lower current conducted by the buffer during the transition thereof.

* * * * *